(12) United States Patent  (10) Patent No.: US 6,700,405 B1
Hirairi  (45) Date of Patent: Mar. 2, 2004

(54) LOGIC CIRCUIT AND FULL ADDER USING THE SAME

(75) Inventor: Kouji Hirairi, Tokyo (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 09/726,430

(22) Filed: Dec. 1, 2000

(30) Foreign Application Priority Data

Dec. 3, 1999 (JP) .......................................... P11-345383

(51) Int. Cl.$^7$ ................................................ G05B 1/00
(52) U.S. Cl. .............................. 326/53; 326/54; 326/55
(58) Field of Search .............................. 326/52–55, 112, 326/113, 119, 121

(56) References Cited

U.S. PATENT DOCUMENTS

| | | | | |
|---|---|---|---|---|
| 5,343,418 A | * | 8/1994 | Zinger | .......................... 364/784 |
| 5,508,641 A | | 4/1996 | Appenzeller | |
| 5,875,124 A | | 2/1999 | Takahashi | |

FOREIGN PATENT DOCUMENTS

| | | | |
|---|---|---|---|
| EP | 0503671 A2 | | 6/1992 |
| JP | 152936 A | * | 6/1993 |
| JP | 05152936 | * | 6/1993 |
| JP | HEI 11-243209 | | 9/1999 |

OTHER PUBLICATIONS

Machine–Assisted Translation (MAT), Thomson Derwent, pp. 1–24.*

Kimeo Ueda et al., "A 64–Bit Carry Look Ahead Adder Using Pass Transistor BiCMOS Gates", IEEE Journal of Solid–State Circuits, vol. 31, No. 6. Jun. 1, 1996, pp. 810–817, IEEE Inc., New York XP–000620184.

Akkouche et al., "Design of a High Performance Array and an Accumulator" Microelectronics Journal, GB, Mackintosh Publications Ltd. Luton, vol. 22, No. 5/06, Sep 1, 1991, pp. 65–73, XP–000337006.

* cited by examiner

Primary Examiner—Anh Tran
(74) Attorney, Agent, or Firm—Rader, Fishman & Grauer PLLC; Ronald P. Kananen

(57) ABSTRACT

A logic circuit capable of suppressing occurrence of wrap-around of signals, capable of reducing power consumption, and in addition achieving a reduction of a circuit scale and an improvement of an operating speed and a full adder using the same, wherein provision is made of an exclusive-OR generation circuit 12 for receiving a first logic signal A and a second logic signal B taking a logic "1" or "0" and generating the exclusive-OR of the first logic signal A and the second logic signal B, a dual signal generation circuit 11 for receiving the first logic signal A and the second logic signal B and generating the dual signal of the exclusive-OR of the first logic signal A and the second logic signal B, and an interpolation circuit 13 for compulsorily setting the output level of the dual signal at the level of the logic "1" when the output level of the exclusive-OR is the logic "0", while compulsorily setting the output level of the exclusive-OR at the level of the logic "0" when the output level of the dual signal is the logic "1".

10 Claims, 15 Drawing Sheets

THE OCCURRENCE
OF WRAPAROUND OF
THE SIGNAL

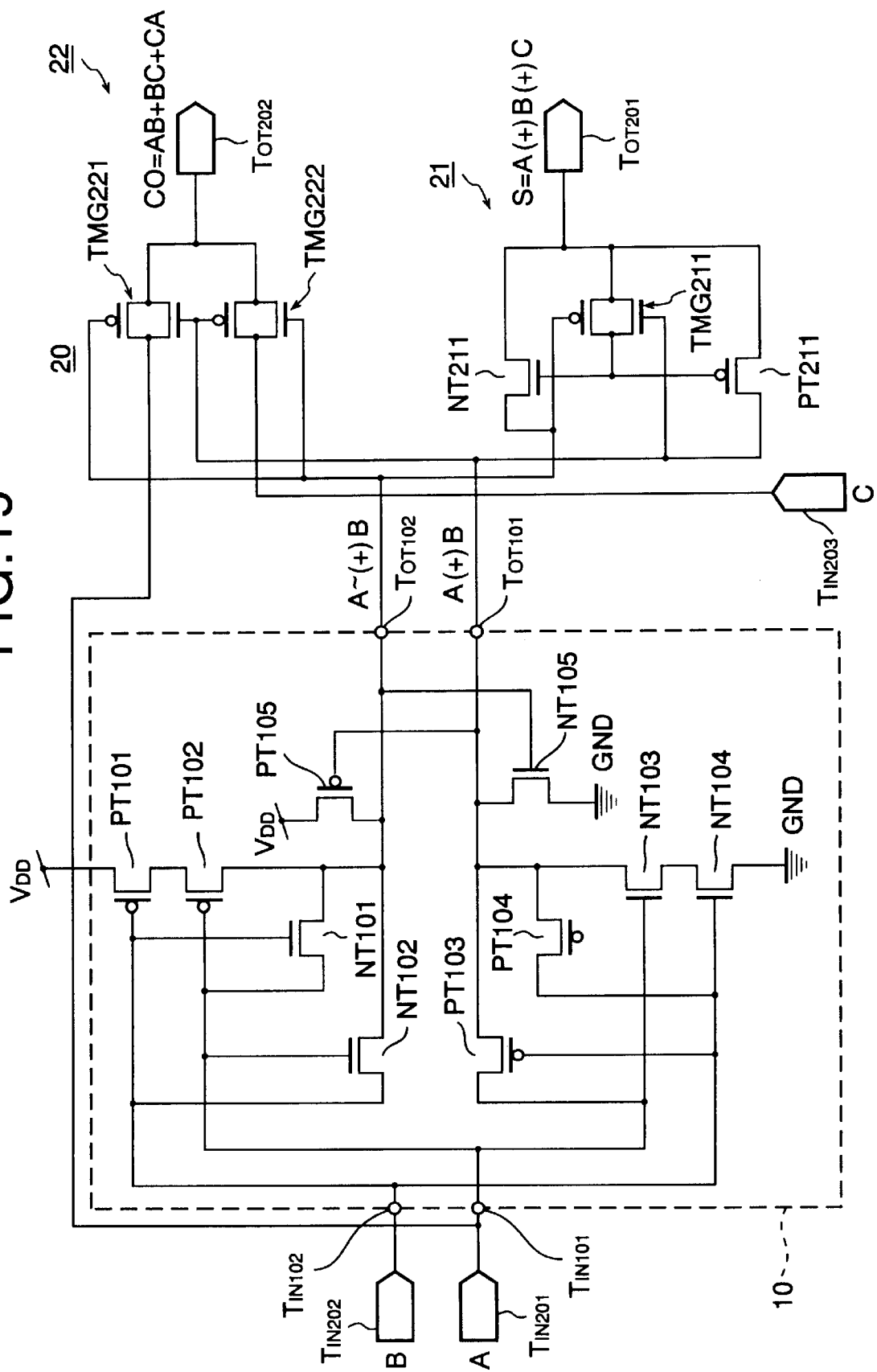

US 6,700,405 B1

LOGIC CIRCUIT AND FULL ADDER USING THE SAME

BACKGROUND OF THE INVENTION

1. Field of the Invention

The present invention relates to a logic circuit in a semiconductor integrated circuit, more particularly relates to a logic circuit for generating an exclusive-OR (EXOR=A (+)B) and a dual signal thereof (EXNOR=A^(+)B) at almost the same time, and a full adder using the same.

2. Description of the Related Art

8tr Type EXOR and EXNOR Logic Circuits

Conventionally, and also at present, the circuit shown in FIG. 1 has been generally frequently used as an EXOR logic circuit, and the circuit shown in FIG. 2 has been generally frequently used as an EXNOR logic circuit (refer to for example John P. Uyemura, "CMOS LOGIC CIRCUIT DESIGN", Kluwer Academic Publishers, 1999, pp. 274 to pp. 275, FIG. 6.21 to 6.22).

An EXOR logic circuit 1 of FIG. 1 comprises two CMOS transmission gates TMG11 and TMG12 and two CMOS inverters INV11 and INV12 and is configured by eight transistors in total.

In this EXOR logic circuit 1, an input terminal TIN11 of a logic signal A is connected to an input terminal of an inverter INV11, a gate of a p-channel MOS (PMOS) transistor of the transmission gate TMG11, and a gate of an n-channel MOS (NMOS) transistor of the transmission gate TMG12.

An output terminal of the inverter INV11 is connected to a gate of the NMOS transistor of the transmission gate TMG11 and a gate of the PMOS transistor of the transmission gate TMG12.

Further, an input terminal TIN12 of a logic signal B is connected to an input terminal of the inverter INV12 and one input/output terminal of the transmission gate TMG11, while an output terminal of the inverter INV12 is connected to one input/output terminal of the transmission gate TMG12.

The other input/output terminals of the transmission gates TMG11 and TMG12 are commonly connected to an output terminal TOT11 of an exclusive-OR A(+)B.

Similarly, an EXNOR logic circuit 2 of FIG. 2 comprises two CMOS transmission gates TMG21 and TMG22 and two CMOS inverters INV21 and INV22 and is configured by eight transistors in total.

In this EXOR logic circuit 2, an input terminal TIN21 of the logic signal A is connected to the input terminal of an inverter INV21, a gate of the PMOS transistor of the transmission gate TMG21, and a gate of the NMOS transistor of the transmission gate TMG22.

An output terminal of the inverter INV21 is connected to a gate of the NMOS transistor of the transmission gate TMG21 and a gate of the PMOS transistor of the transmission gate TMG22.

Further, an input terminal TIN22 of the logic signal B is connected to an input terminal of the inverter INV22 and one input/output terminal of the transmission gate TMG22, while an output terminal of the inverter INV22 is connected to one input/output terminal of the transmission gate TMG21.

The other input/output terminals of the transmission gates TMG21 and TMG22 are commonly connected to an output terminal TOT21 of a dual signal A^(+)B of the exclusive-OR A(+)B.

6tr Type EXOR and EXNOR Logic Circuits

Further, as an improvement of the 8tr type, there are 6tr type EXOR and EXNOR logic circuits as shown in FIG. 3 and FIG. 4 (refer to for example John P. Uyemura, "CMOS LOGIC CIRCUIT DESIGN", Kluwer Academic Publishers, 1999, pp. 275, FIG. 6.23).

The 6tr type EXOR circuit 3 shown in FIG. 3 comprises a PMOS transistor PT31, an NMOS transistor NT31, a transmission gate TMG31, and an inverter INV31 and is configured by six transistors in total.

An input terminal TIN31 of the logic signal A is connected to the gates of the PMOS transistor PT31 and the NMOS transistor TN31 and one input/output terminal of the transmission gate TMG31.

An input terminal TIN32 of the logic signal B is connected to a source of the PMOS transistor PT31 and an input terminal of the inverter INV31, while an output terminal of the inverter INV31 is connected to a source of the NMOS transistor NT31.

The drains of the PMOS transistor PT31 and the NMOS transistor NT31 and the other input/output terminal of the transmission gate TMG31 are commonly connected to an output terminal TOT31 of the exclusive-OR A(+)B.

Similarly, the 6tr type EXNOR circuit 4 shown in FIG. 4 comprises a PMOS transistor PT41, an NMOS transistor NT41, a transmission gate TMG41, and an inverter INV41 and is configured by six transistors in total.

An input terminal TIN41 of the logic signal A is connected to the gates of the PMOS transistor PT41 and the NMOS transistor TN41 and one input/output terminal of the transmission gate TMG41.

An input terminal TIN42 of the logic signal B is connected to a source of the NMOS transistor NT41 and an input terminal of the inverter INV41, while an output terminal of the inverter INV41 is connected to a source of the PMOS transistor PT41.

The drains of the PMOS transistor PT41 and the NMOS transistor NT41 and the other input/output terminal of the transmission gate TMG41 are commonly connected to an output terminal TOT41 of the dual signal A^(+)B of the exclusive-OR A(+)B.

These 6tr type EXOR logic circuit 3 and EXNOR logic circuit 4 are decreased in the number of transistors by two from the 8tr type logic circuits shown in FIG. 1 and FIG. 2 and are excellent in the points of area efficiency and power consumption in comparison with those of the 8tr type.

4tr Type EXOR and EXNOR Logic Circuits

Further, there are 4tr type EXOR and EXNOR logic circuits configured by four transistors as shown in FIG. 5 and FIG. 6 (refer to for example John P. Uyemura, "CMOS LOGIC CIRCUIT DESIGN", Kluwer Academic Publishers, 1999, pp. 256, FIG. 5.79).

The 4tr type EXOR circuit 5 shown in FIG. 5 comprises PMOS transistors PT51 and PT52 and NMOS transistors NT51 and NT52 and is configured by four transistors in total.

The PMOS transistor PT51 is connected between an input terminal TIN51 of the logic signal A and an output terminal TOT51 of the exclusive-OR A(+)B, while the PMOS transistor PT52 is connected between an input terminal TIN52 of the logic signal B and the output terminal TOT51.

Further, the NMOS transistors NT51 and NT52 are connected in series between the output terminal TOT51 and a ground GND.

The gate of the PMOS transistor PT52 and the gate of the NMOS transistor NT51 are connected to the input terminal TIN51, while the gate of the PMOS transistor PT51 and the gate of the NMOS transistor NT52 are connected to the input terminal TIN52.

Similarly, the 4tr type EXNOR circuit 6 shown in FIG. 6 comprises PMOS transistors PT61 and PT62 and NMOS transistors NT61 and NT62 and is configured by four transistors in total.

The NMOS transistor NT61 is connected between an input terminal TIN61 of the logic signal A and an output terminal TOT61 of the dual signal A^(+)B of the exclusive-OR A(+)B, while the NMOS transistor NT62 is connected between an input terminal TIN62 of the logic signal B and the output terminal TOT61.

Further, the PMOS transistors PT61 and PT62 are connected in series between a supply line of a power supply voltage $V_{DD}$ and the output terminal TOT61.

The gate of the PMOS transistor PT62 and the gate of the NMOS transistor NT62 are connected to the input terminal TIN61, while the gate of the PMOS transistor PT61 and the gate of the NMOS transistor NT61 are connected to the input terminal TIN62.

As one element circuit frequently used in a processor in an integrated circuit, there is a full adder.

FIG. 7 is a circuit diagram of an example of the configuration of a generation circuit of a carry signal CO of a full adder.

This carry signal generation circuit 7 is configured by an EXOR logic circuit 71, transmission gates TMG71 and TMG72, and an inverter INV71.

An input terminal TIN71 of the logic signal A is connected to one input terminal of the EXOR logic circuit 71 and one input/output terminal of the transmission gate TMG71, while an input terminal TIN72 of the logic signal B is connected to the other input terminal of the EXOR logic circuit 71. Further, an input terminal TIN73 of the carry signal C is connected to one input/output terminal of a transmission gate TMG72.

Further, an output terminal of the EXOR logic circuit 71 is connected to an input terminal of the inverter INV71, a gate of the PMOS transistor of the transmission gate TMG71, and a gate of the NMOS transistor of the transmission gate TMG72.

An output terminal of the inverter INV71 is connected to a gate of the NMOS transistor of the transmission gate TMG71 and a gate of the PMOS transistor of the transmission gate TMG72.

The other input/output terminals of the transmission gates TMG71 and TMG72 are commonly connected to the output terminal TOT71 of the carry signal CO.

The carry signal generation logic described in textbooks and the like is CO=A·B+B·C+C·A, but generally is realized as CO=(A^(+)B)·A+(A(+)B)·C by commonly using A(+)B which becomes necessary for generating a sum signal S=A(+)B(+)C (refer to for example John P. Uyemura, "CMOS LOGIC CIRCUIT DESIGN", Kluwer Academic Publishers, 1999, pp. 276 to pp. 277, equation (6.45), FIG. 6.25).

The A^(+)B necessary for the generation of the carry signal CO is obtained by inversion of the exclusive-OR A(+)B. At this time, due to the delay of one inverter, a phase difference occurs between the signals A(+)B and A^(+)B.

This situation is shown more generalized in FIGS. 8A and 8B.

Since there is a phase difference between a signal S and an inverted signal ^S thereof, the point at which the two signals intersect is not on a center value of the amplitude.

When the intersecting point is at a potential lower than the center value, it is determined that both S1 and ^S have a logic value "0" in terms of the logic circuit. Similarly, when the intersecting point is at a potential higher than the center value, it is determined that the two are "1".

Under the situation where S=^S, both of the two selectors configured by two CMOS transmission gates become ON.

When the two input signals are different from each other at this time, a logic collision occurs, there is an electrical short-circuit, and a current flows. Such a phenomenon is generally known as "wraparound of the signal".

FIG. 9 and FIG. 10 are diagrams of the results of simulation in the cases of conventional 8tr type and 6tr type EXOR logic circuits having inverters for inverting the input signals and passing the outputs thereof through one inverter.

As apparent from the diagrams, in the conventional 8tr type and 6tr type EXOR logic circuits, phase differences arise between the two outputs and therefore the intersecting points are not at the center values of the amplitudes.

Further, although the 4tr type EXOR and EXNOR logic circuits each configured by four transistors may, at first glance, seem superior to the 6tr type logic circuit, in actuality they are not superior.

In FIG. 5, when A=0 and B=0, the two PMOS transistors PT51 and PT52 become ON, and a logic potential "0" is transferred to the output through the two PMOS transistors PT51 and PT52.

However, the PMOS transistors PT51 and PT52 cannot completely transfer the logic potential "0" and therefore a potential which has become higher by the amount of the threshold value of the PMOS transistors appears at the output.

On the other hand, in FIG. 6, when A=1 and B=1, the two PMOS transistors PT61 and PT62 cut off, the two NMOS transistors NT61 and NT62 become ON, and a logic potential "1" is transferred to the output through the two NMOS transistors NT61 and NT62.

However, the NMOS transistors NT61 and NT62 cannot completely transfer the logic potential "1" and therefore a potential which has become lower by the amount of the threshold value of the NMOS transistors appears at the output.

Signals of such incomplete logic potentials exert a serious influence upon a low voltage operation margin and noise margin. For this reason, in actuality, it is necessary to provide and use inverters INV51 and INV61 as buffers for restoration of the potential as shown in FIG. 11 and FIG. 12.

SUMMARY OF THE INVENTION

The present invention was made in consideration with such a circumstance and has as an object thereof to provide a logic circuit capable of suppressing an occurrence of wraparound of a signal, capable of reducing the power consumption, and achieving a reduction of circuit scale and an improvement of operating speed and a full adder using the same.

According to a first aspect of the present invention, there is provided a logic circuit, comprising an exclusive-OR generation circuit for receiving a first logic signal and a second logic signal taking a first or second level and generating an exclusive-OR of the first logic signal and second logic signal, a dual signal generation circuit for receiving the first logic signal and the second logic signal taking the first or second level and generating a dual signal of the exclusive-OR of the first logic signal and second logic signal, and an interpolation circuit for compulsorily setting an output level of said dual signal at the first level when the output level of said exclusive-OR is the second level.

According to a second aspect of the present invention, there is provided a logic circuit, comprising an exclusive-OR generation circuit for receiving a first logic signal and a second logic signal taking a first or second level and generating an exclusive-OR of the first logic signal and second logic signal, a dual signal generation circuit for receiving the first logic signal and the second logic signal taking the first or second level and generating a dual signal of the exclusive-OR of the first logic signal and second logic signal, and an interpolation circuit for compulsorily setting the output level of said exclusive-OR at the second level when the output level of said dual signal is the first level.

According to a third aspect of the present invention, there is provided a logic circuit, comprising an exclusive-OR generation circuit for receiving a first logic signal and a second logic signal taking a first or second level and generating an exclusive-OR of the first logic signal and second logic signal, a dual signal generation circuit for receiving the first logic signal and the second logic signal taking the first or second level and generating a dual signal of the exclusive-OR of the first logic signal and second logic signal, and an interpolation circuit for compulsorily setting an output level of said dual signal at the first level when the output level of said exclusive-OR is the second level, while compulsorily setting the output level of said exclusive-OR at the second level when the output level of said dual signal is the first level.

According to a fourth aspect of the present invention, there is provided a logic circuit, comprising a first input terminal with a first logic signal taking a first or second level input thereto; a second input terminal with a second logic signal taking a first or second level input thereto; a first output terminal for outputting an exclusive-OR; a second output terminal for outputting a dual signal of said exclusive-OR; a dual signal generation circuit having first conductivity type first and second transistors connected in series between said first level use power supply potential and said second output terminal, turning ON when the signal of second level is supplied to the control terminal, while cutting off when the signal of first level is supplied, a second conductivity type first transistor connected between said first input terminal and said second output terminal, turning ON when the signal of first level is supplied to the control terminal, while cutting off when the signal of second level is supplied, and a second conductivity type second transistor connected between said second input terminal and said second output terminal, turning on when the signal of first level is supplied to the control terminal, while cutting off when the signal of second level is supplied; an exclusive-OR generation circuit having a first conductivity type third transistor connected between said first input terminal and said first output terminal, turning ON when the signal of second level is supplied to the control terminal, while cutting off when the signal of first level is supplied, a first conductivity type fourth transistor connected between said second input terminal and said first output terminal, turning on when the signal of second level is supplied to the control terminal, while cutting off when the signal of first level is supplied, and second conductivity type third and fourth transistors connected in series between said second level use power supply potential and said first output terminal, turning on when the signal of first level is supplied to the control terminal, while cutting off when the signal of second level is supplied; and an interpolation circuit having a first conductivity type fifth transistor connected in series between said first level use power supply potential and said second output terminal, turning on when the signal of second level is supplied to the control terminal, while cutting off when the signal of first level is supplied, and a second conductivity type fifth transistor connected in series between said second level use power supply potential and said first output terminal, turning on when the signal of first level is supplied to the control terminal, while cutting off when the signal of second level is supplied, wherein the control terminals of said first conductivity type second and fourth transistors and second conductivity type second and third transistors are connected to said first input terminal; the control terminals of said first conductivity type first and third transistors and second conductivity type first and fourth transistors are connected to said second input terminal; the control terminal of said first conductivity type fifth transistor is connected to said first output terminal; and the control terminal of said second. conductivity type fifth transistor is connected to said second output terminal.

According to a fifth aspect of the present invention, there is provided a full adder, comprising a logic circuit having an exclusive-OR generation circuit for receiving a first logic signal and a second logic signal taking a first or second level and generating an exclusive-OR of the first logic signal and second logic signal, a dual signal generation circuit for receiving the first logic signal and the second logic signal taking the first or second level and generating a dual signal of the exclusive-OR of the first logic signal and second logic signal, and an interpolation circuit for compulsorily setting an output level of said dual signal at the first level when the output level of said exclusive-OR is the second level, a sum signal generation circuit for generating a sum signal based on an exclusive-OR output and a dual signal output of said logic circuit, and a carry signal generation circuit for generating a carry signal by selecting said first logic signal or carry signal based on the exclusive-OR output and the dual signal output of said logic circuit.

According to a sixth aspect of the present invention, there is provided a full adder, comprising a logic circuit having an exclusive-OR generation circuit for receiving a first logic signal and a second logic signal taking a first or second level and generating an exclusive-OR of the first logic signal and second logic signal, a dual signal generation circuit for receiving the first logic signal and the second logic signal taking the first or second level and generating a dual signal of the exclusive-OR of the first logic signal and second logic signal, and an interpolation circuit for compulsorily setting the output level of said exclusive-OR at the second level when the output level of said dual signal is the first level; a sum signal generation circuit for generating a sum signal based on the exclusive-OR output and the dual signal output of said logic circuit; and a carry signal generation circuit for generating a carry signal by selecting said first logic signal or carry signal based on the exclusive-OR output and the dual signal output of said logic circuit.

According to a seventh aspect of the present invention, there is provided a full adder, comprising a logic circuit having an exclusive-OR generation circuit for receiving a first logic signal and a second logic signal taking a first or second level and generating an exclusive-OR of the first logic signal and second logic signal, a dual signal generation circuit for receiving the first logic signal and the second logic signal taking the first or second level and generating a dual signal of the exclusive-OR of the first logic signal and second logic signal, and an interpolation circuit for compulsorily setting an output level of said dual signal at the first level when the output level of said exclusive-OR is the second level, while compulsorily setting the output level of said exclusive-OR at the second level when the output level of said dual signal is the first level; a sum signal generation circuit for generating a sum signal based on an exclusive-OR output and a dual signal output of said logic circuit; and a carry signal generation circuit for generating a carry signal by selecting said first logic signal or carry signal based on the exclusive-OR output and the dual signal output of said logic circuit.

According to a eighth aspect of the present invention, there is provided a full adder, comprising a logic circuit having a first input terminal with a first logic signal taking a first or second level input thereto, a second input terminal with a second logic signal taking a first or second level input thereto, a first output terminal for outputting an exclusive-OR, a second output terminal for outputting a dual signal of said exclusive-OR, a dual signal generation circuit which has first conductivity type first and second transistors connected in series between said first level use power supply potential and said second output terminal, turning ON when the signal of second level is supplied to the control terminal, while cutting off when the signal of first level is supplied, a second conductivity type first transistor connected between said first input terminal and said second output terminal, turning ON when the signal of first level is supplied to the control terminal, while cutting off when the signal of second level is supplied, and a second conductivity type second transistor connected between said second input terminal and said second output terminal, turning on when the signal of first level is supplied to the control terminal, while cutting off when the signal of second level is supplied, an exclusive-OR generation circuit which has a first conductivity type third transistor connected between said first input terminal and said first output terminal, turning ON when the signal of second level is supplied to the control terminal, while cutting off when the signal of first level is supplied, a first conductivity type fourth transistor connected between said second input terminal and said first output terminal, turning on when the signal of second level is supplied to the control terminal, while cutting off when the signal of first level is supplied, and second conductivity type third and fourth transistors connected in series between said second level use power supply potential and said first output terminal, turning on when the signal of first level is supplied to the control terminal, while cutting off when the signal of second level is supplied, and an interpolation circuit which has a first conductivity type fifth transistor connected in series between said first level use power supply potential and said second output terminal, turning on when the signal of second level is supplied to the control terminal, while cutting off when the signal of first level is supplied, and a second conductivity type fifth transistor connected in series between said second level use power supply potential and said first output terminal, turning on when the signal of first level is supplied to the control terminal, while cutting off when the signal of second level is supplied, wherein the control terminals of said first conductivity type second and fourth transistors and second conductivity type second and third transistors are connected to said first input terminal, the control terminals of said first conductivity type first and third transistors and second conductivity type first and fourth transistors are connected to said second input terminal, the control terminal of said first conductivity type fifth transistor is connected to said first output terminal, and the control terminal of said second conductivity type fifth transistor is connected to said second output terminal; a sum signal generation circuit for generating a sum signal based on an exclusive-OR output and a dual signal output of said logic circuit; and a carry signal generation circuit for generating a carry signal by selecting said first logic signal or carry signal based on the exclusive-OR output and the dual signal output of said logic circuit.

Further, in the present invention, said first conductivity type first, second, third, fourth, and fifth transistors are p-channel field effect transistors, and said second conductivity type first, second, third, fourth, and fifth transistors are n-channel field effect transistors.

According to the logic circuit of the present invention, the exclusive-OR (EXOR=A(+)B) and the dual signal thereof (EXNOR=A^(+)B) are approximately simultaneously generated without generating an inversion of the two first and second input logic signals A and B.

At this time, in accordance with for example the level of the input signal, when the output level of the exclusive-OR is the second level, the output level of the dual signal is compulsorily set at the first level by the interpolation circuit.

Further, when the output level of the dual signal is the first level, the output level of the exclusive-OR is compulsorily set at the second level.

Further, according to the full adder of the present invention, the dual signal is generated in the logic circuit and supplied to the carry signal generation circuit.

Accordingly, an inverter for inverting the logic as in the conventional circuit is unnecessary. As a result, the occurrence of wraparound of the signal is suppressed.

BRIEF DESCRIPTION OF THE DRAWINGS

These and other objects and features of the present invention will become clearer from the following description of the preferred embodiments given with reference to the accompanying drawings, in which:

FIG. 19 is a circuit diagram of an example of the configuration of a full adder using the EXOR/EXNOR logic circuit according to the present invention.

DESCRIPTION OF THE PREFERRED EMBODIMENTS

Below, preferred embodiments will be described with reference to the accompanying drawings.

Figure 13:
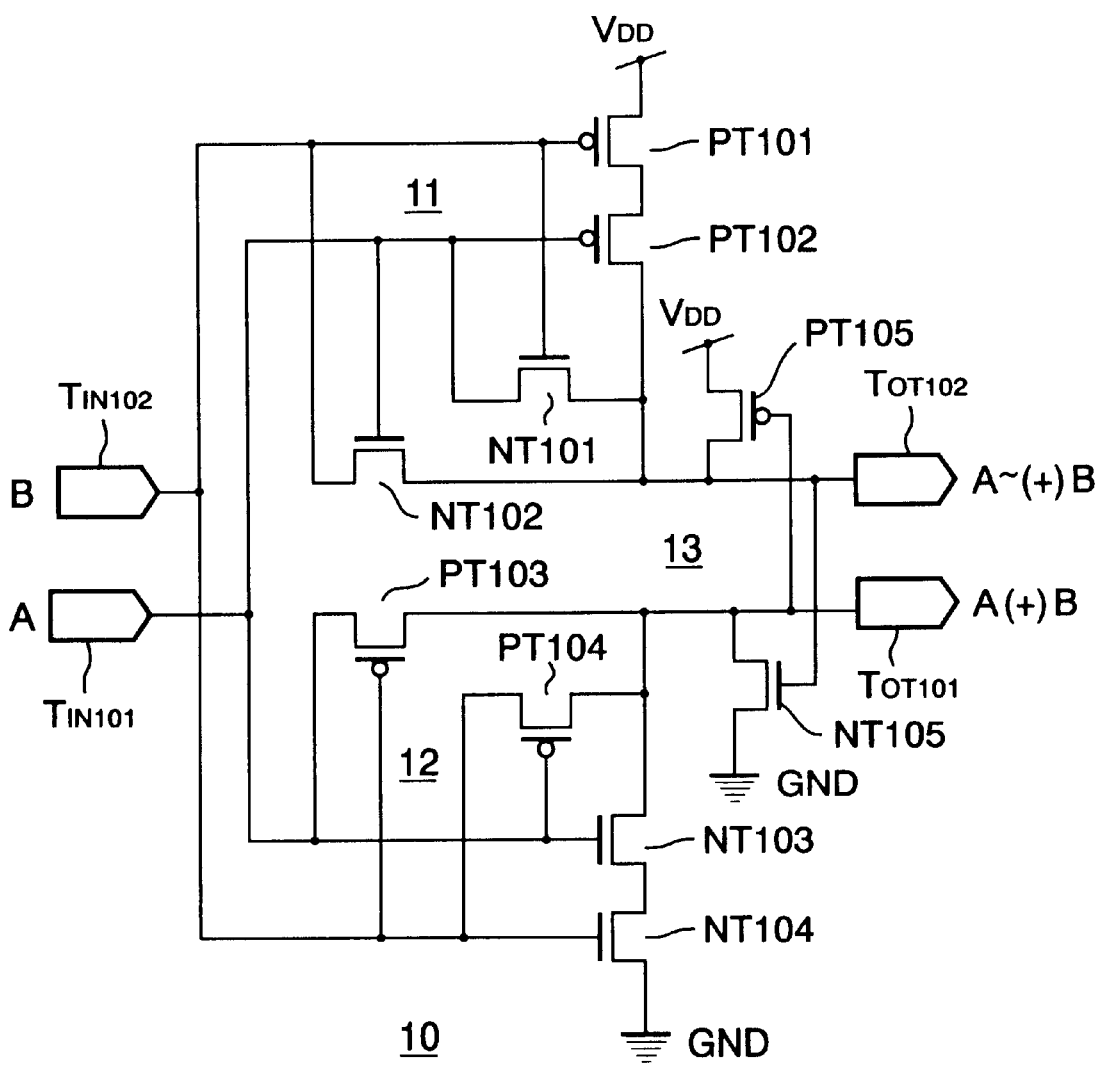
FIG. 13 is a circuit diagram of an embodiment of an EXOR/EXNOR logic circuit according to the present invention.

FIG. 13 is a circuit diagram of an embodiment of an EXOR/EXNOR logic circuit according to the present invention.

This EXOR/EXNOR logic circuit 10 comprises PMOS transistors PT101 to PT105 as first conductivity type (p-channel) first to fifth transistors, NMOS transistors NT101 to NT105 as second conductivity type (n-channel) first to fifth transistors, a first input terminal TIN101 for the first logic signal A, a second input terminal TIN102 for the second logic signal B, a first output terminal TOT101 for the exclusive-OR A(+)B, and a second output terminal TOT102 for the dual signal A^(+)B of the exclusive-OR A(+)B.

Among these configuration elements, a dual signal generation circuit 11 is configured by the PMOS transistors PT101 and PT102 and the NMOS transistors NT101 and NT102, an exclusive-OR circuit 12 is configured by the PMOS transistors PT103 and PT104 and the NMOS transistors NT103 and NT104, and an interpolation circuit 13 is configured by the PMOS transistor PT105 and the NMOS transistor NT105.

In this way, the EXOR/EXNOR logic-circuit 10 according to the present invention uses 10 transistors of the PMOS transistors PT101 to PT105 and the NMOS transistors NT101 to NT105 as the main configuration elements. There is no inverter for inverting the input signal as seen in the conventional 8tr and 6tr type logic circuits.

The PMOS transistor PT103 is connected between the input terminal TIN101 of the logic signal A and the output terminal TOT101 of the exclusive-OR A(+)B, and the PMOS transistor PT104 is connected between the input terminal TIN102 of the logic signal B and the output terminal TOT101.

The NMOS transistor NT101 is connected between the input terminal TIN101 of the logic signal A and the output terminal TOT102 of the dual signal A^(+)B of the exclusive-OR A(+)B, and the NMOS transistor NT102 is connected between the input terminal TIN102 of the logic signal B and the output terminal TOT102.

Further, the PMOS transistors PT101 and PT102 are connected in series between the supply line of the power supply voltage $V_{DD}$ and the output terminal TOT102, and the PMOS transistor PT105 is connected between the supply line of the power supply voltage $V_{DD}$ and the output terminal TOT102 in parallel to this.

Further, the NMOS transistors NT103 and NT104 are connected in series between the output terminal TOT101 and the ground GND, and the NMOS transistor NT105 is connected between the output terminal TOT101 and the ground GND in parallel to this.

Further, the gates of the PMOS transistors PT102 and PT104 and the gates of the NMOS transistors NT102 and NT103 are connected to the input terminal TIN101, and the gates of the PMOS transistors PT101 and PT103 and the gates of the NMOS transistors NT101 and NT104 are connected to the input terminal TIN102.

Further, the gate of the PMOS transistor PT105 is connected to the output terminal TOT101, and the gate of the NMOS transistor NT105 is connected to the output terminal TOT102.

Next, the operation by the above configuration will be explained with reference to FIG. 14 to FIG. 17.

Figure 14:
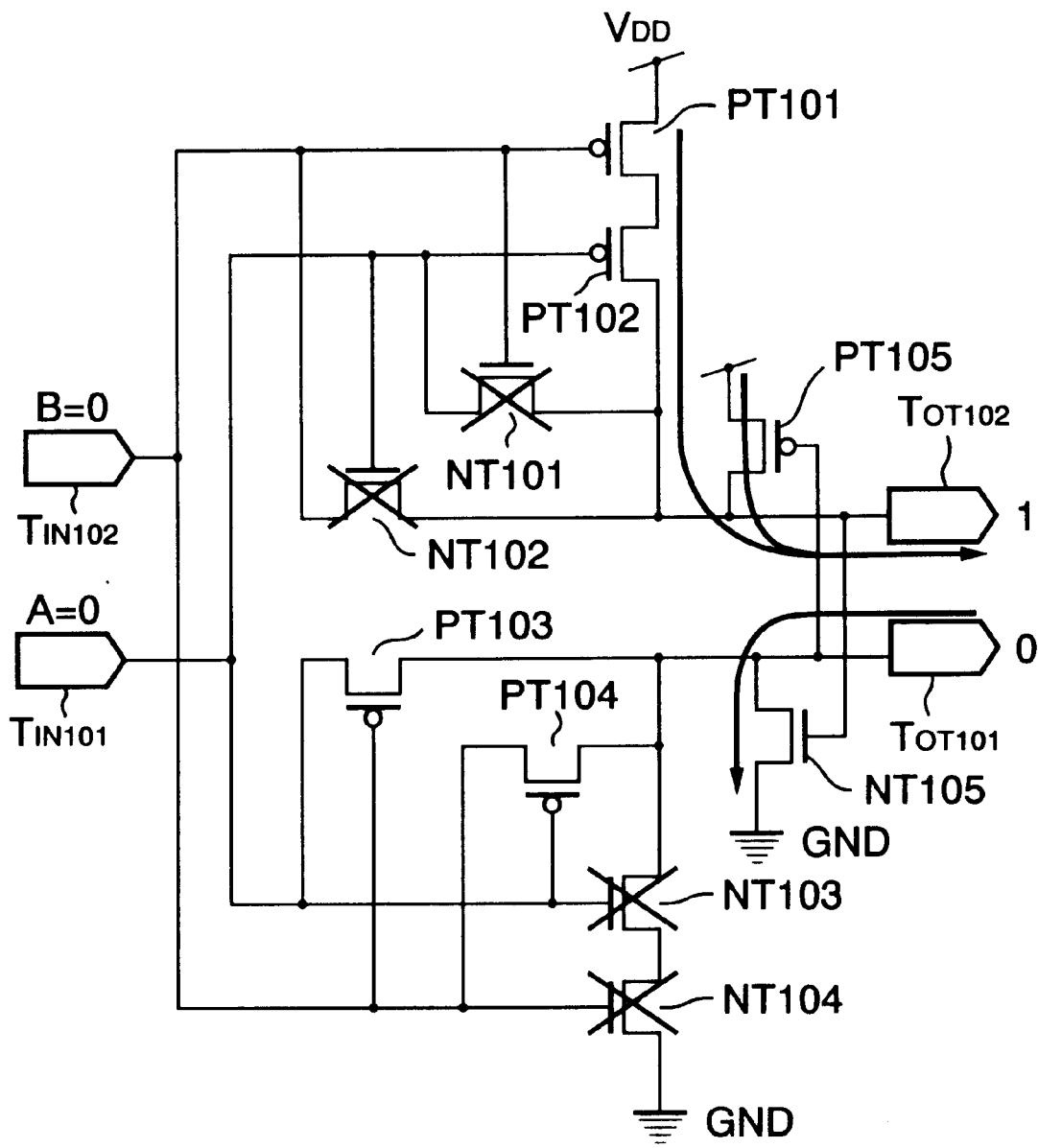
FIG. 14 is a diagram for explaining an operation of the circuit of FIG. 13 when A=B=0.
Figure 15:
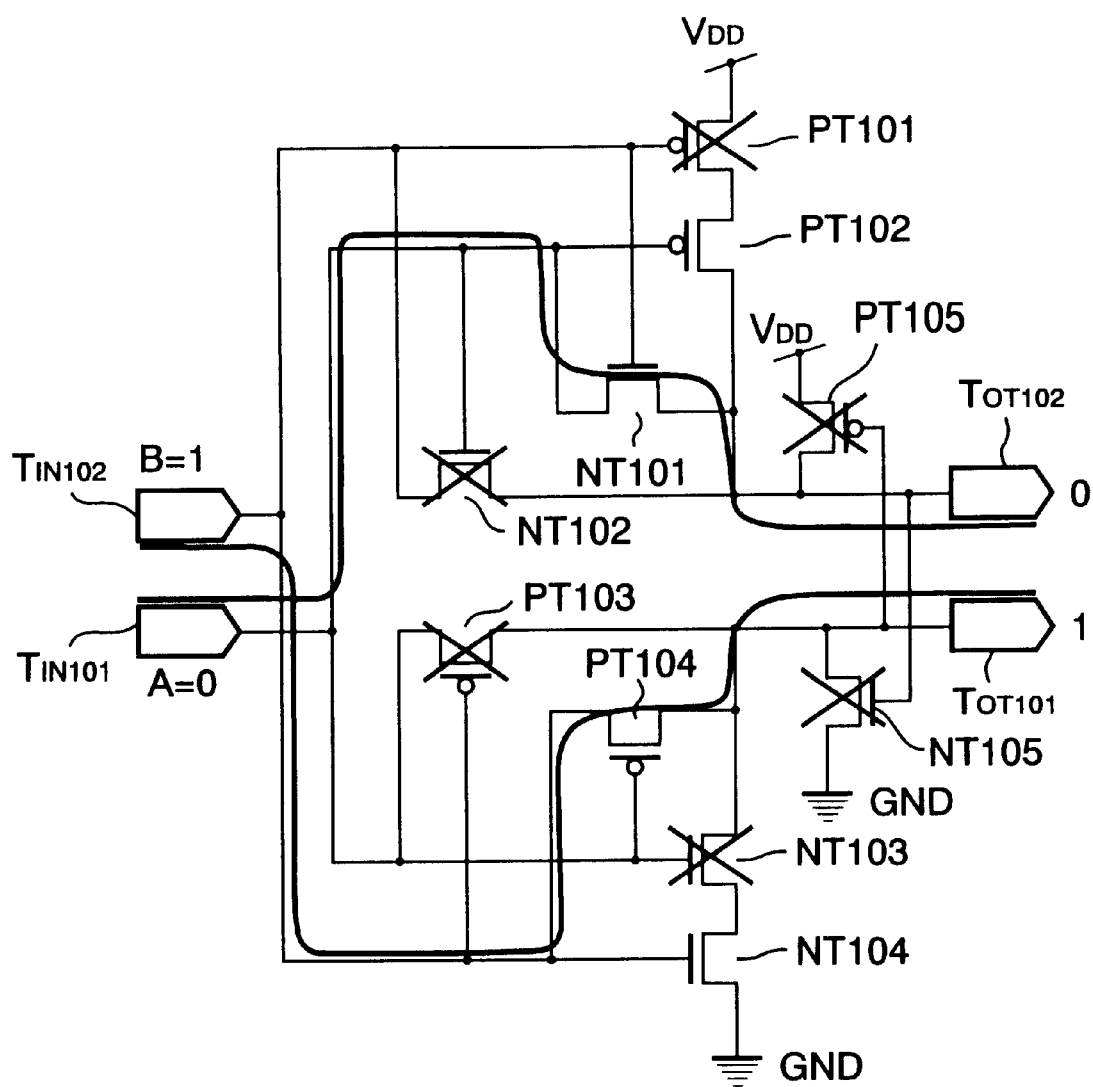
FIG. 15 is a diagram for explaining an operation of the circuit of FIG. 13 when A=0 and B=1.
Figure 16:
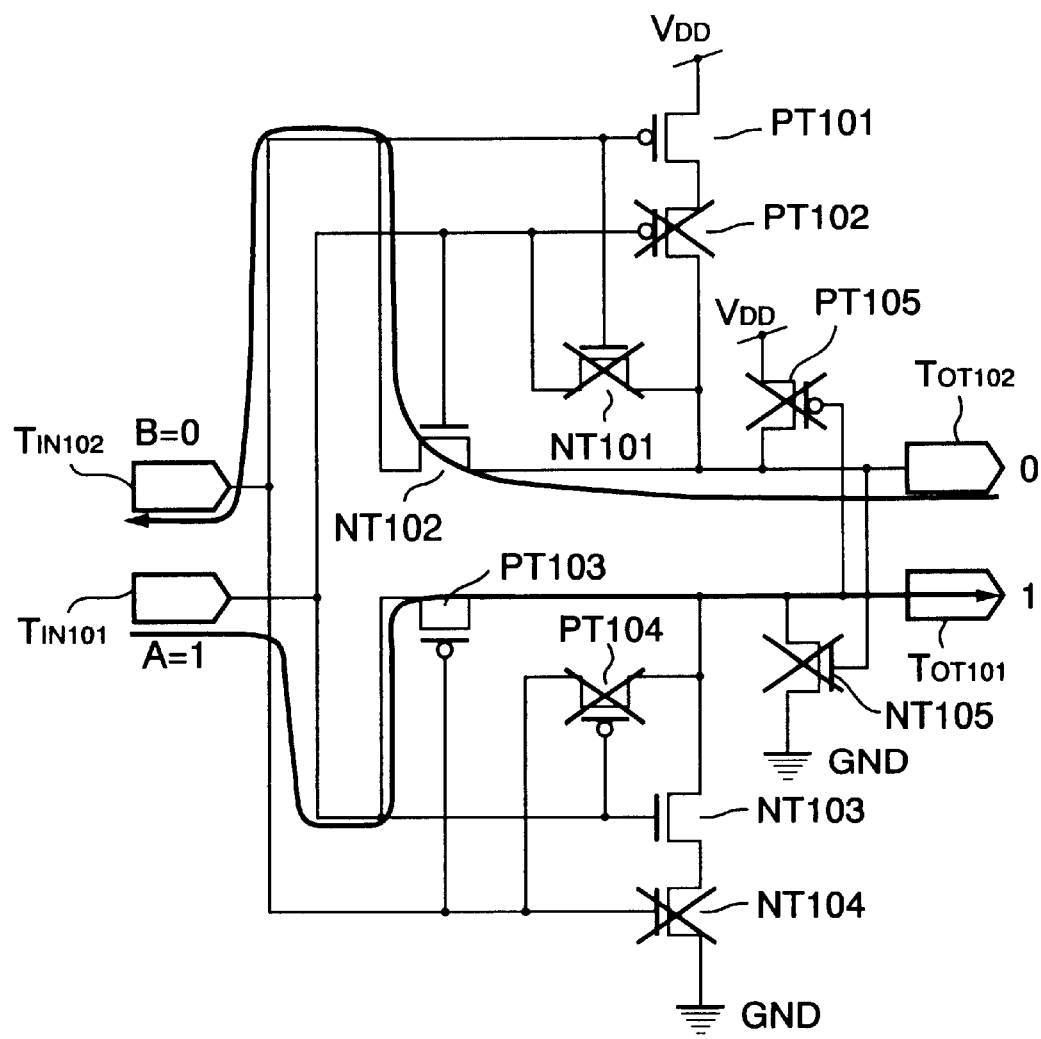
FIG. 16 is a diagram for explaining an operation of the circuit of FIG. 13 when A=1 and B=0.
Figure 17:
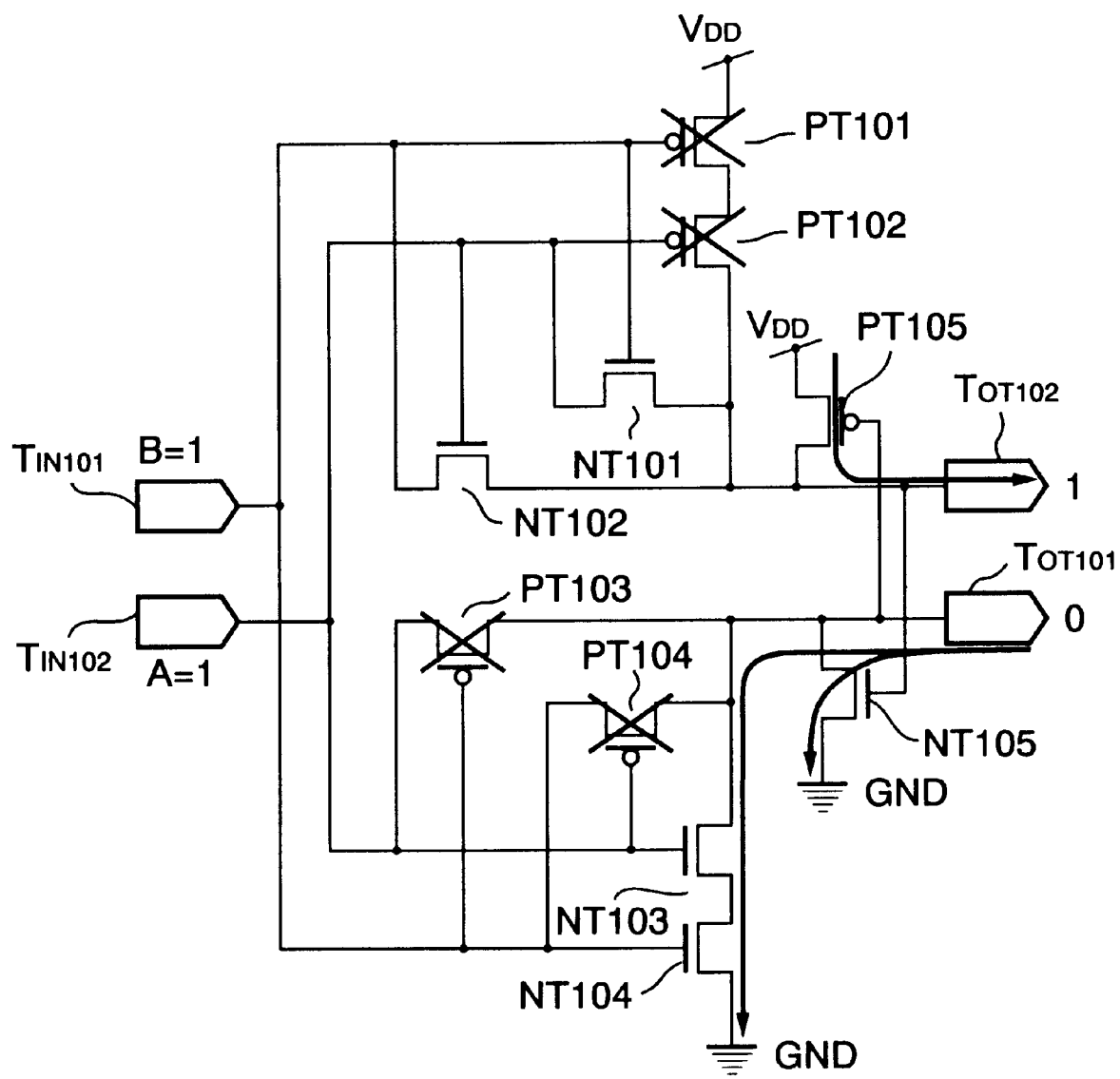
FIG. 17 is a diagram for explaining an operation of the circuit of FIG. 13 when A=1 and B=1.

FIG. 14 is a view for explaining the operation in a case where the logic signals A=0 and B=0, FIG. 15 is a view for explaining the operation in a case where A=0 and B=1, FIG. 16 is a view for explaining the operation in a case where A=1 and B=0, and FIG. 17 is a view for explaining the operation in a case where A=1 and B=1.

Note that, transistors given the marks x in the figures show the cut off state. Further, arrows indicate charge and discharge routes of the output contacts.

When A=0 and B=0, as shown in FIG. 14, the PMOS transistors PT101 to PT105 turn ON, and the NMOS transistors NT101 to NT104 cut off.

By this, the potential of the output terminal TOT102 is pulled up to the power supply voltage $V_{DD}$ level, and the dual signal output A^(+)B becomes a logic "1".

Further, by the PMOS transistors PT103 and PT104, the exclusive-OR A(+)B output from the output terminal TOT101I can start to change to a logic "0".

At this time, due to the PMOS transistors PT103 and PT104, the logic does not become a complete "0", but the NMOS transistor NT105 connected to the output terminal TOT102 with the gate pulled up to the power supply voltage $V_{DD}$ with a slight delay turns ON. By this, the output terminal TOT101 is pulled into the ground level, and the exclusive-OR A(+)B reaches the logic "0".

Further, by the pull-in of the output terminal TOT101 to the ground level, the PMOS transistor PT105 with the gate connected to the output terminal TOT101 completely turns ON, and, by this, the dual signal output A^(+)B is stably kept at the logic "1".

When A=0 and B=1, as shown in FIG. 15, the PMOS transistors PT102 and PT104 and the NMOS transistors NT101 and NT104 turn ON, and the PMOS transistors PT101, PT103, and PT105 and the NMOS transistors NT102, NT103, and NT105 cut off.

Then, the potential of the output terminal TOT102 is pulled into the logic "0" level, that is, the ground level (0V), through the NMOS transistor NT101 and the input terminal TIN101, and the dual signal output A^(+)B becomes the logic "0".

Further, the signal B input to the input terminal TIN102 through the PMOS transistor PT104 having the logic "1", that is, the power supply voltage $V_{DD}$ level, is propagated to the output terminal TOT101, and as a result, the exclusive-OR output A(+)B reaches the logic When A=1 and B=0, as shown in FIG. 16, the PMOS transistors PT101 and PT103 and the NMOS transistors NT102 and NT103 turn ON, and the PMOS transistors PT102, PT104, and PT105 and the NMOS transistors NT101, NT104, and NT105 cut off.

Then, the potential of the output terminal TOT102 is pulled into the logic "0"level, that is, the ground level (0V), through the NMOS transistor NT102 and the input terminal TIN102, and the dual signal output A^(+)B becomes the logic "0".

Further, the signal A input to the input terminal TIN101 through the PMOS transistor PT103 having the logic "1", that is, the power supply voltage $V_{DD}$ level, is propagated to the output terminal TOT101, and as a result, the exclusive-OR output A(+)B reaches the logic When A=1 and B=1, as shown in FIG. 17, the NMOS transistors NT101 to NT105 turn ON, and the PMOS transistors PT101 to PT104 cut off.

Along with the turning ON of the NMOS transistors NT103, NT104 and NT105, the output terminal TOT101 is pulled into the ground level, the exclusive-OR output A(+)B becomes the logic "0".

Further, the signals A and B of the logic "1" input to the input terminals TIN101 and TIN102 through the NMOS transistors NT101 and NT102 are propagated to the output terminal TOT102, and the dual signal output A^(+)B can start to change to the logic "1".

At this time, if the signals are passed through the NMOS transistors NT101 and NT102, they do not become completely "1", but the PMOS transistor PT105 connected to the output terminal TOT101 with the gate pulled into the ground level turns ON with a slight delay. By this, the output terminal TOT102 is pulled up to the power supply voltage $V_{DD}$ level through the PMOS transistor PT105, and the dual signal output A^(+)B reaches the logic "1".

In this way, the routes reaching the outputs A^(+)B and A(+)B from the change of the input signal are substantially equal. For this reason, there is almost no phase difference created between the two output signals.

Figure 18:
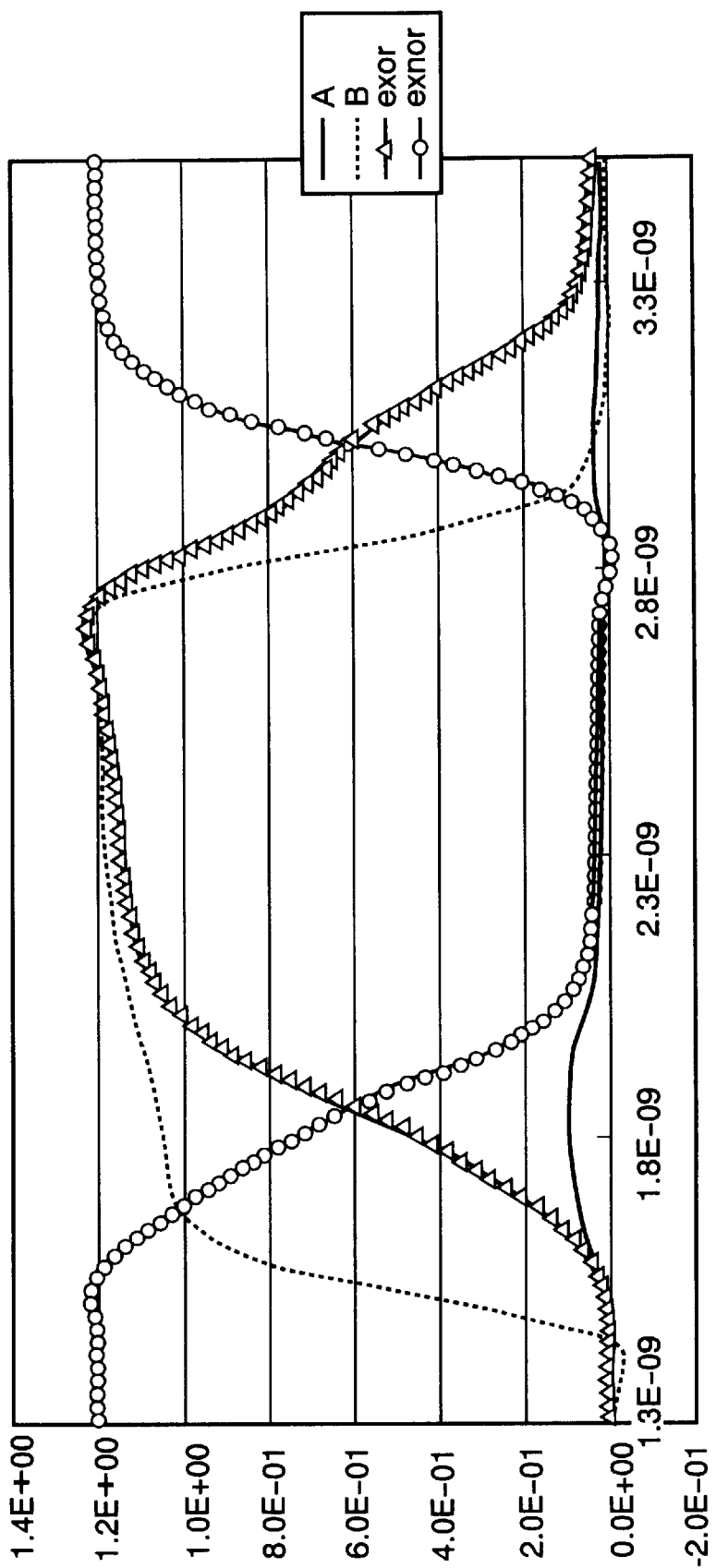
FIG. 18 is a diagram of the results of simulation of the circuit of FIG. 13.

FIG. 18 is a diagram of the results of simulation of the circuit of FIG. 13.

In FIG. 18, a curve indicated by a solid line shows the input logic signal A, a curve indicated by a broken line shows the input logic signal B, a curve indicated by a solid line with triangles shows the exclusive-OR output (EXOR), and a curve indicated by a solid line with squares shows the dual signal output (EXNOR).

Figure 1:
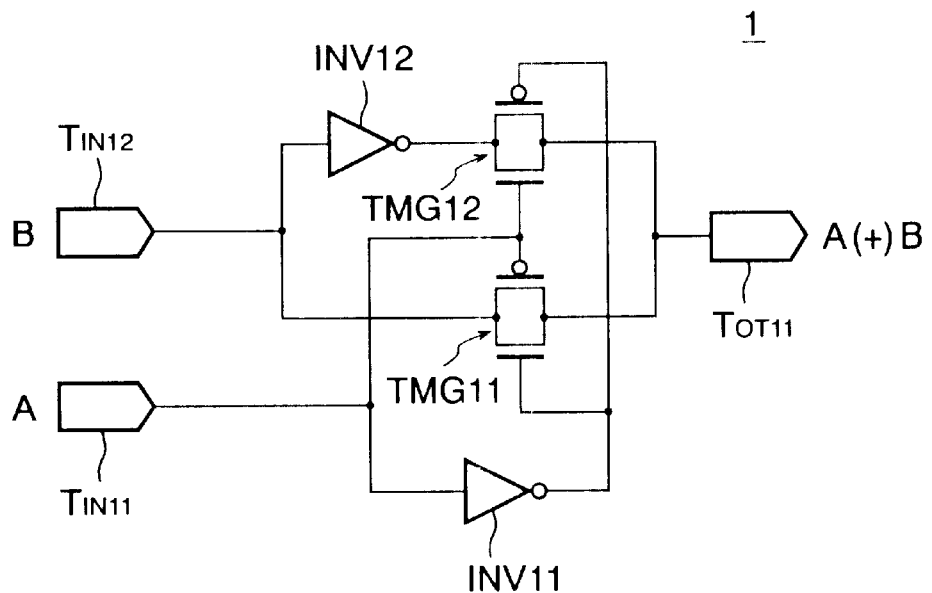
FIG. 1 is a circuit diagram of an example of the configuration of an 8tr type EXOR logic circuit.
Figure 2:
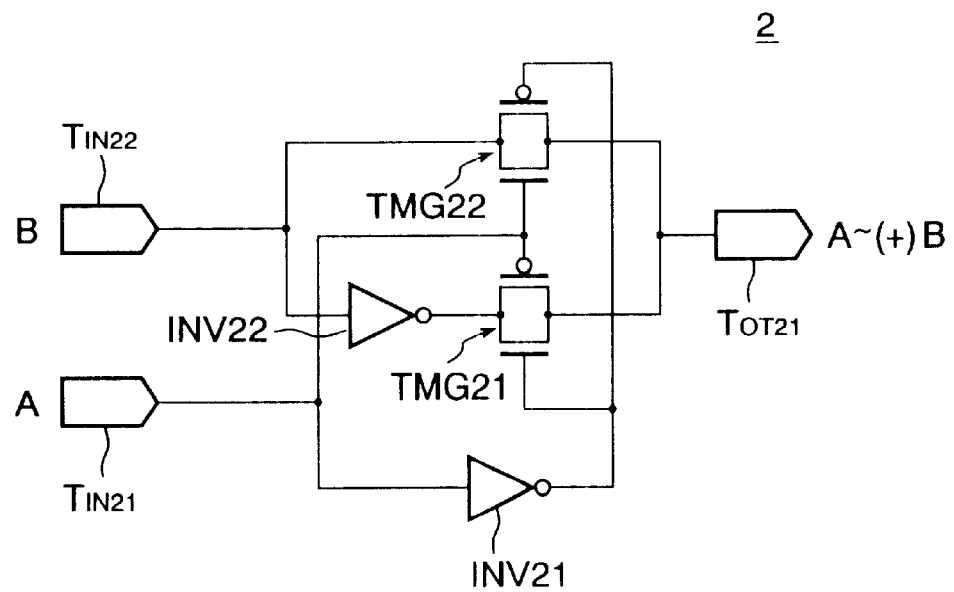
FIG. 2 is a circuit diagram of an example of the configuration of an 8tr type EXNOR logic circuit.
Figure 3:
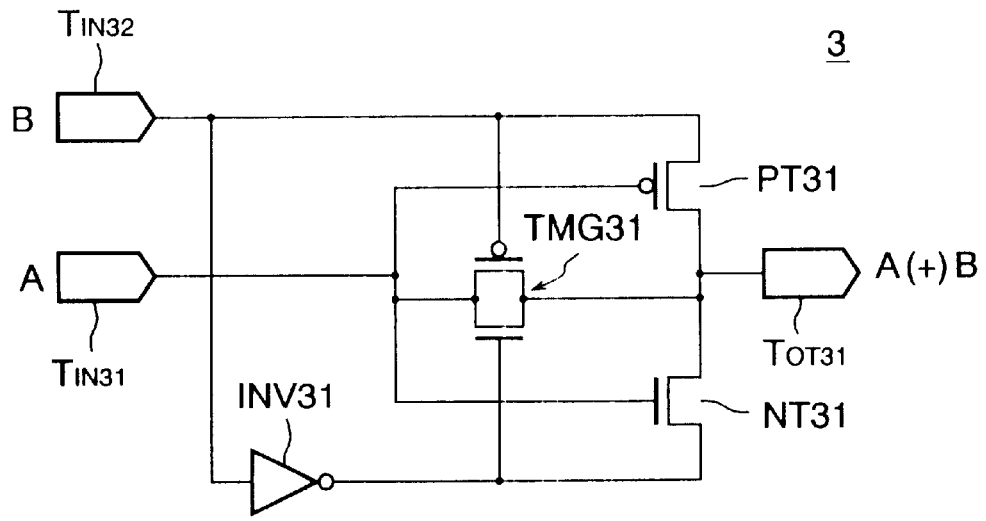
FIG. 3 is a circuit diagram of an example of the configuration of a 6tr type EXOR logic circuit.
Figure 4:
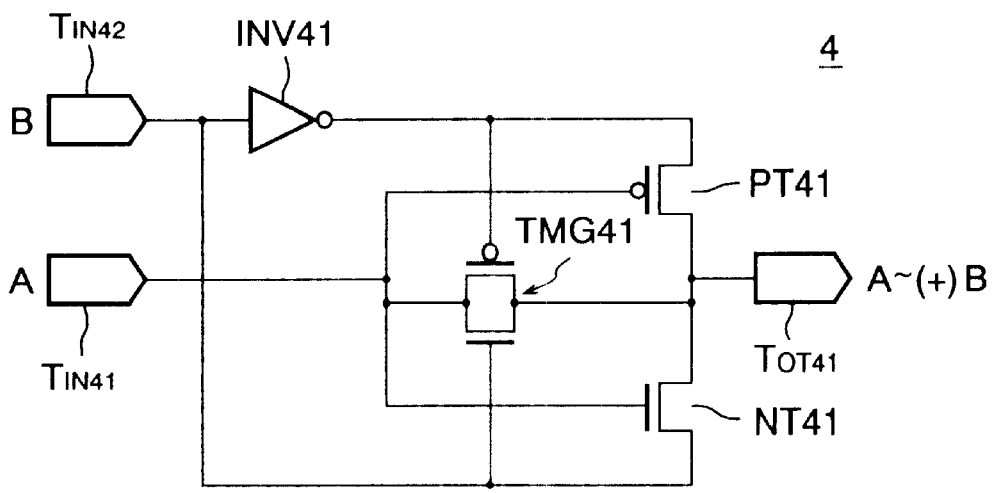
FIG. 4 is a circuit diagram of an example of the configuration of a 6tr type EXNOR logic circuit.
Figure 5:
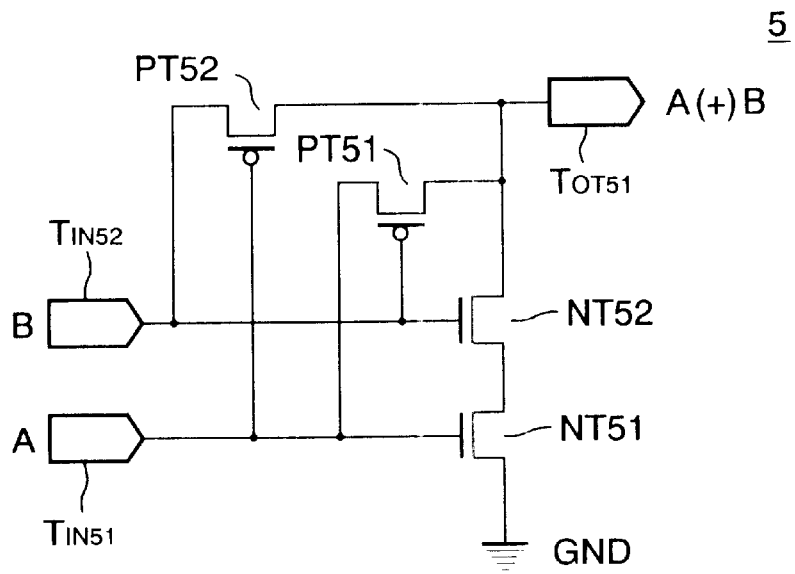
FIG. 5 is a circuit diagram of an example of the configuration of a 4tr type EXOR logic circuit.
Figure 6:
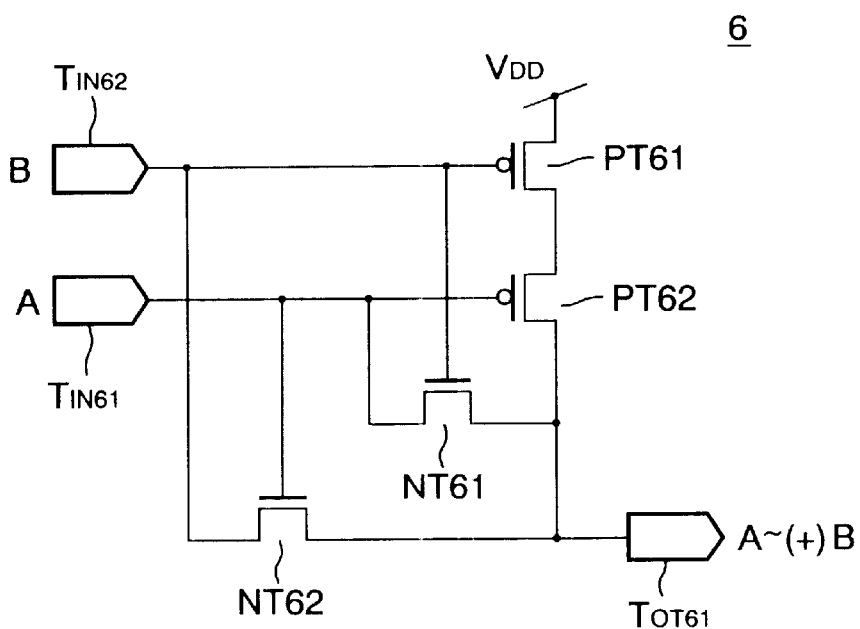
FIG. 6 is a circuit diagram of an example of the configuration of a 4tr type EXNOR logic circuit.
Figure 7:
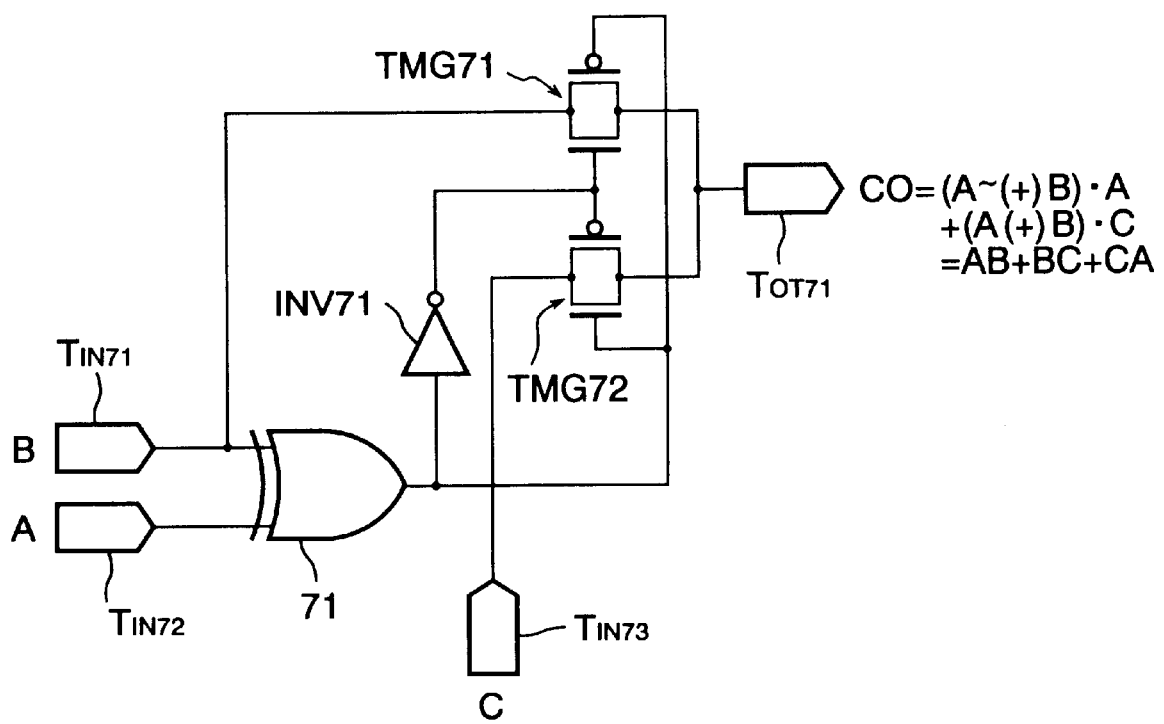
FIG. 7 is a circuit diagram of an example of the configuration of a carry generation circuit of the full adder.
Figure 8A:
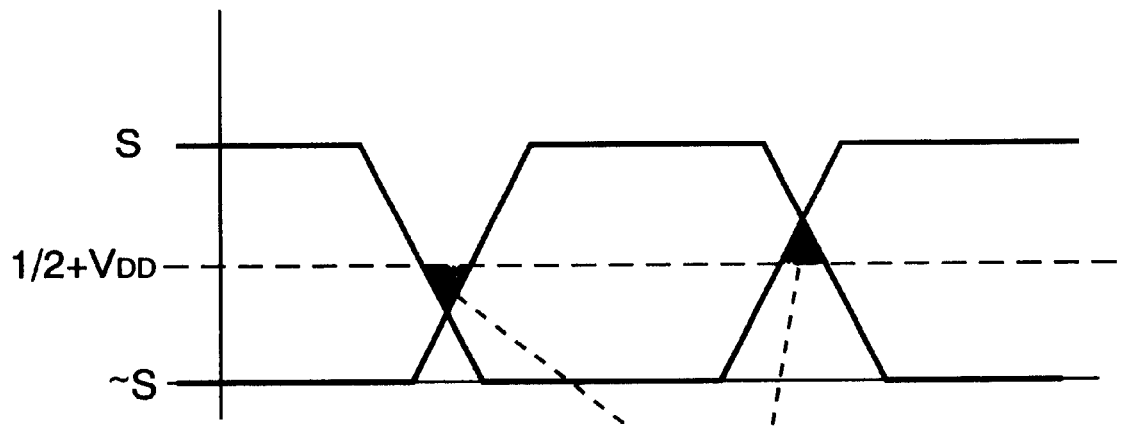
FIGS. 8A and 8B are diagrams for explaining the problem of the circuit of FIG. 7.
Figure 8B:
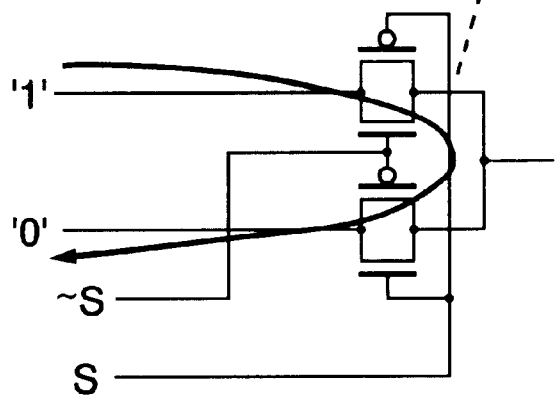
Figure 9:
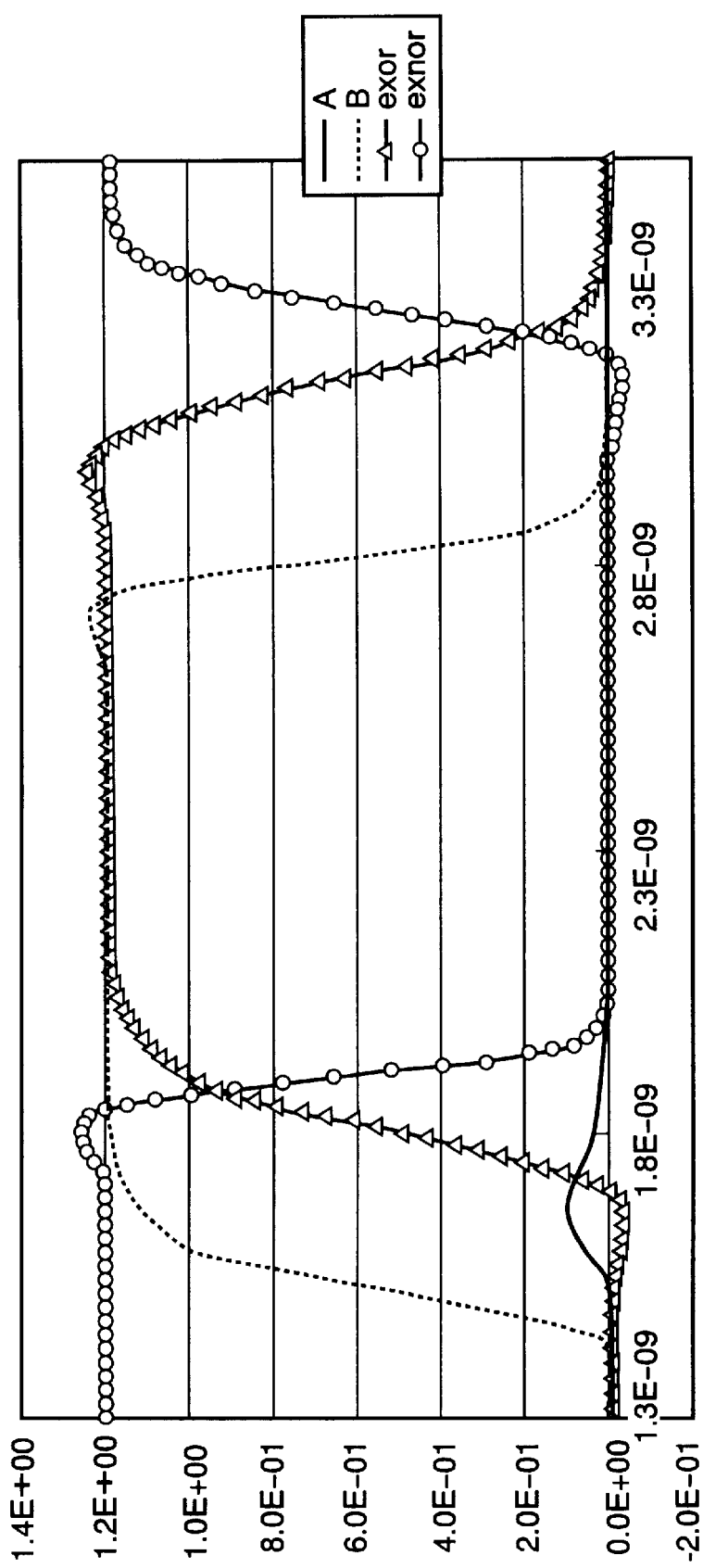
FIG. 9 is a diagram of the results of simulation in the case of an 8tr type EXOR logic circuit having an inverter for inverting the input signals and passing the output thereof through one inverter.
Figure 10:
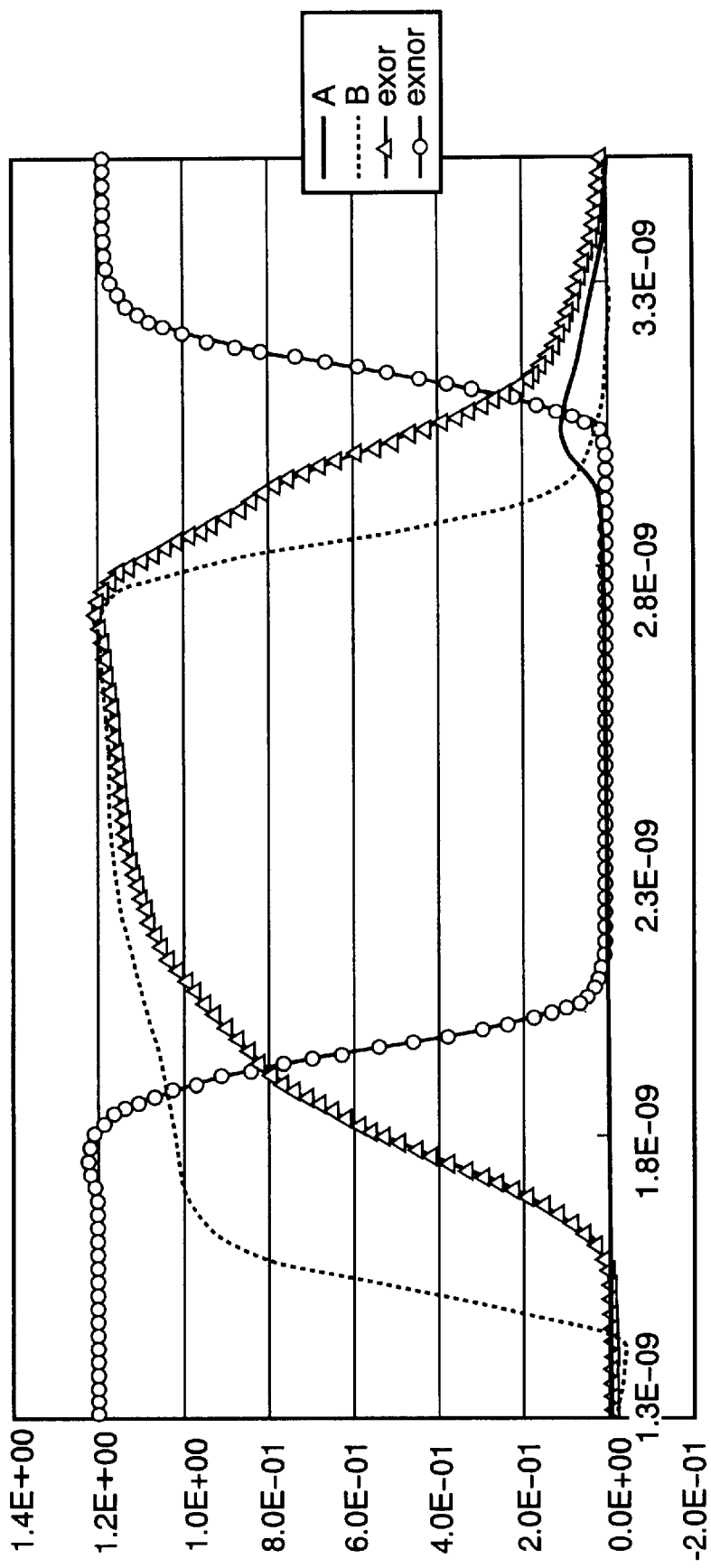
FIG. 10 is a diagram of the results of simulation in the case of a 6tr type EXOR logic circuit having an inverter for inverting the input signals and passing the output thereof through one inverter.
Figure 11:
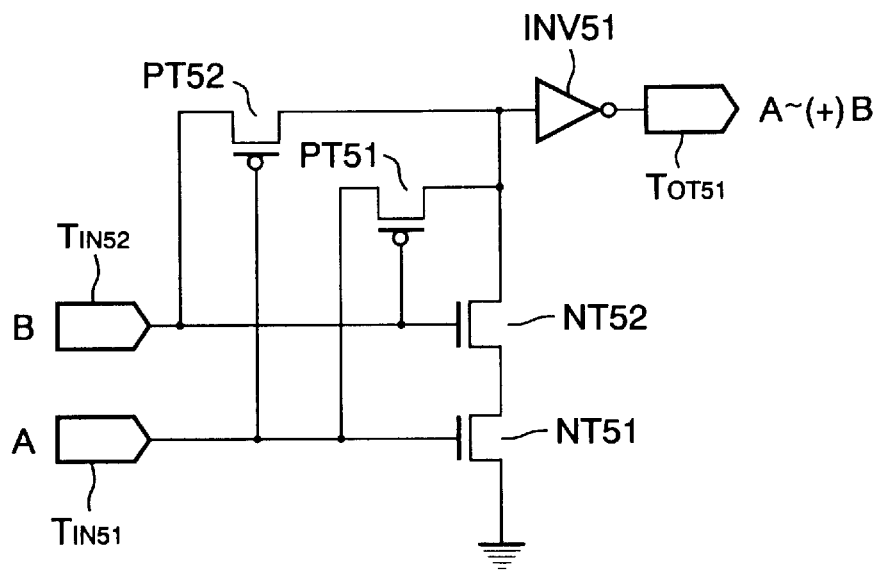
FIG. 11 is a diagram for explaining the problem of a 4tr type logic circuit.
Figure 12:
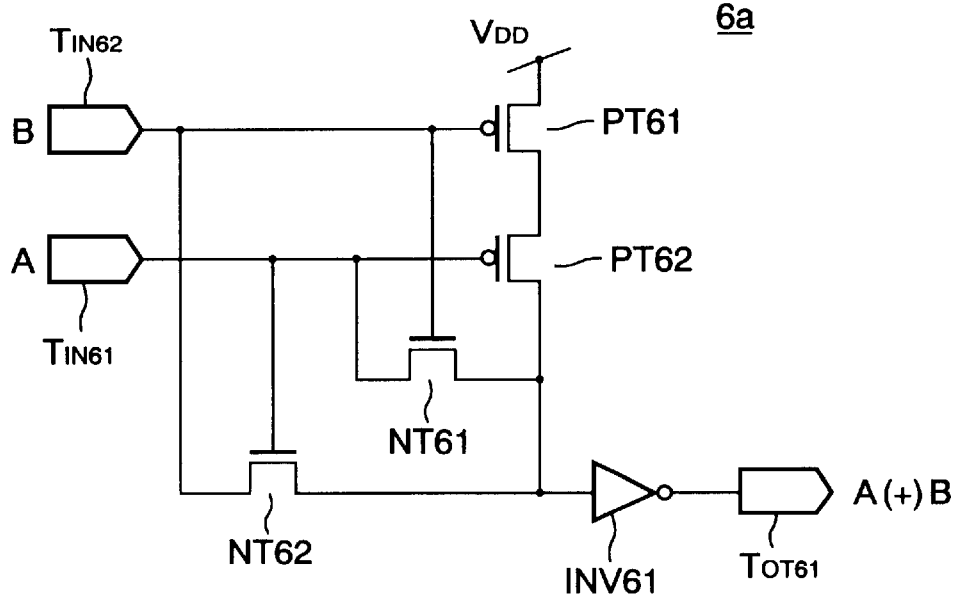
FIG. 12 is a diagram for explaining the problem of a 4tr type logic circuit.

As explained with reference to FIG. 9 and FIG. 10, in each of the 8tr type and 6tr type logic circuits based on the related art, a phase difference is created between the two outputs, and the intersecting point is not at the center value of the amplitude.

Contrary to this, according to the logic circuit according to the present invention, as apparent from FIG. 18, the intersecting point of two output waveforms is substantially at the center value.

Accordingly, according to the circuit of the present invention, even in a case where two input signals are different from each other, an occurrence of logic collision is prevented, no current due to short-circuiting flows, and a "signal wraparound" phenomenon can be suppressed.

Further, in FIG. 18, while slight, improvements in terms of speed are also shown. The circuit scale is 10 transistors including the amount of the inverter. Excellent characteristics can be realized without a large increase in the number of elements compared with the related art.

As explained above, according to the present embodiment, since provision is made of the exclusive-OR generation circuit 12 for receiving the first logic signal A and the second logic signal B taking the logic "1" or "0" and generating the exclusive-OR of the first logic signal A and the second logic signal B, the dual signal generation circuit 11 for receiving the first logic signal A and the second logic signal B and generating the dual signal of the exclusive-OR of the first logic signal A and the second logic signal B, and the interpolation circuit 13 for compulsorily setting the output level of the dual signal at the level of the logic "1" when the output level of the exclusive-OR is the logic "0", while compulsorily setting the output level of the exclusive-OR at the level of the logic "0"when the output level of the dual signal is the logic "1", the occurrence of wraparound of the signal can be suppressed and the power consumption can be reduced.

Further, there is an advantage that a reduction of the circuit scale can be achieved and, in addition, an improvement of the operating speed can be achieved.

FIG. 19 is a circuit diagram of an example of the configuration of a full adder using the EXOR/EXNOR logic circuit according to the present invention.

A full adder 20 is configured by using the EXOR/EXNOR logic circuit 10 of FIG. 13 and connecting a sum generation circuit 21 and a carry signal generation circuit 22 to the output side thereof and is characterized in that there is no inverter for the inversion of the EXOR output unlike that according to the related art.

Further, the full adder 20 comprises an input terminal TIN201 of the logic signal A, an input terminal TIN202 of the logic signal B, an output terminal TOT201 of a sum signal S [=A(+)B(+)C]], and an output terminal TOT202 of the carry signal CO (=AB+BC+CA).

The sum signal generation circuit 21 is configured by a PMOS transistor PT211, an NMOS transistor NT211, and a transmission gate TMG211.

The PMOS transistor PT211 is connected between the output terminal TOT101 of the EXOR/EXNOR logic circuit 10 and the output terminal TOT201 of the sum signal, and its gate is connected to one input/output terminal of the transmission gate TMG211.

The NMOS transistor NT211 is connected between the output terminal TOT102 of the EXOR/EXNOR logic circuit 10 and the output terminal TOT201 of the sum signal, and its gate is connected to one input/output terminal of the transmission gate TMG211.

A gate of the PMOS transistor of the transmission gate TMG211 is connected to the output terminal TOT101 of the EXOR/EXNOR logic circuit 10, a gate of the NMOS transistor is connected to the output terminal TOT102 of the EXOR/EXNOR logic circuit 10, and the other input/output terminal is connected to the output terminal TOT201 of the sum signal.

The carry signal generation circuit 22 is configured by CMOS transmission gates TMG221 and TMG222.

One input/output terminal of the transmission gate TMG221 is connected to the input terminal TIN201 of the logic signal A, and the other input/output terminal is connected to the output terminal TOT202 of the carry over signal CO.

A gate of the PMOS transistor of the transmission gate TMG221 is connected to the output terminal TOT101 of the EXOR/EXNOR logic circuit 10, and a gate of the NMOS transistor is connected to the output terminal TOT102 of the EXOR/EXNOR logic circuit 10.

Further, one input/output terminal of the transmission gate TMG222 is connected to an input terminal TIN203 of the carry signal C, and the other input terminal is connected to the output terminal TOT202 of the carry over signal CO.

A gate of the PMOS transistor of the transmission gate TMG222 is connected to the output terminal TOT102 of the EXOR/EXNOR logic circuit 10, and a gate of the NMOS transistor is connected to the output terminal TOT101 of the EXOR/EXNOR logic circuit 10.

In the full adder 29 having such a configuration, when the input logic signal A=B=0, as shown in FIG. 14, the exclusive-OR output A(+)B becomes equal to 0, and the dual signal output A^(+)B thereof becomes equal to 1.

By this, in the sum signal generation circuit 21, the transmission gate TMG211 becomes the conductive state, the PMOS transistor PT211 or the NMOS transistor NT211 turns ON in accordance with the potential of the output terminal TOT201, the signal of the logic "0" is propagated through the PMOS transistor PT211 to the output terminal TOT201, or the signal of the logic "1" is propagated through the NMOS transistor NT211 to the output terminal TOT201.

Further, in the carry signal generation circuit 22, the transmission gate TMG221 is held in the conductive state, and the transmission gate TMG222 is held in the nonconductive state. As a result, the signal of the logic "0" input to the input terminal TIN201 is propagated to the output terminal TOT202.

When the input logic signals A=0 and B=1, as shown in FIG. 15, the exclusive-OR output A(+)B becomes equal to 1, and the dual signal output A^(+)B thereof becomes equal to 0.

By this, in the sum signal generation circuit 21, the transmission gate TMG211 is held in the nonconductive state.

Further, in the carry signal generation circuit 22, the transmission gate TMG221 is held in the nonconductive state, and the transmission gate TMG222 is held in the conductive state. As a result, the carry signal C of the input terminal TIN203 is propagated to the output terminal TOT202.

When the input logic signals A=1 and B=0, as shown in FIG. 16, the exclusive-OR output A(+)B becomes equal to 1, and the dual signal output A^(+)B thereof becomes equal to 0.

By this, in the sum signal generation circuit 21, the transmission gate TMG211 is held in the nonconductive state.

Further, in the carry signal generation circuit 22, the transmission gate TMG221 is held in the nonconductive state, and the transmission gate TMG222 is held in the conductive state. As a result, the carry signal C of the input terminal TIN203 is propagated to the output terminal TOT202.

When the input logic signals A=B=1, as shown in FIG. 17, the exclusive-OR output A(+)B becomes equal to 0, and the dual signal output A^(+)B thereof becomes equal to 1.

By this, in the sum signal generation circuit 21, the transmission gate TMG211 becomes the conductive state, the PMOS transistor PT211 or the NMOS transistor NT211 turns ON in accordance with the potential of the output terminal TOT201, the signal of the logic "0" is propagated through the PMOS transistor PT211 to the output terminal TOT201, or the signal of the logic "1" is propagated through the NMOS transistor NT211 to the output terminal TOT201.

Further, in the carry signal generation circuit 22, the transmission gate TMG221 is held in the conductive state, and the transmission gate TMG222 is held in the nonconductive state. As a result, the signal of the logic "0" input to the input terminal TIN201 is propagated to the output terminal TOT202.

According to the full adder 20, the dual signal of EXOR is generated in the EXOR/EXNOR logic circuit 10 and supplied to the carry signal generation circuit, therefore the current generated due to wraparound of the signal can be suppressed and the power consumption can be reduced.

Summarizing the effects of the invention, as explained above, according to the present invention, the occurrence of wraparound of the signal can be suppressed and the power consumption can be reduced.

Further, there is an advantage that a reduction of the circuit scale can be achieved and in addition an improvement of the operating speed can be achieved.

Note that the present invention is not limited to the above embodiments and includes modifications within the scope of the claims.

What is claimed is:

1. A logic circuit, comprising:
   an exclusive-OR generation circuit for receiving a first logic signal and a second logic signal taking a first or second level and generating an exclusive-OR of the first logic signal and second logic signal,
   a dual signal generation circuit for receiving the first logic signal and the second logic signal taking the first or second level and generating a dual signal of the exclusive-OR of the first logic signal and second logic signal,
   an interpolation circuit for compulsorily setting an output level of said dual signal at the first level when the output level of said exclusive-OR is the second level, and
   circuit means coupled to said interpolation circuit for providing an adding function.

2. A logic circuit, comprising:
   an exclusive-OR generation circuit for receiving a first logic signal and a second logic signal taking a first or second level and generating an exclusive-OR of the first logic signal and second logic signal,
   a dual signal generation circuit for receiving the first logic signal and the second logic signal taking the first or second level and generating a dual signal of the exclusive-OR of the first logic signal and second logic signal,
   an interpolation circuit for compulsorily setting the output level of said exclusive-OR at the second level when the output level of said dual signal is the first level, and
   circuit means coupled to said interpolation circuit for providing an adding function.

3. A logic circuit, comprising:
   an exclusive-OR generation circuit for receiving a first logic signal and a second logic signal taking a first or second level and generating an exclusive-OR of the first logic signal and second logic signal,
   a dual signal generation circuit for receiving the first logic signal and the second logic signal taking the first or second level and generating a dual signal of the exclusive-OR of the first logic signal and second logic signal,
   an interpolation circuit for compulsorily setting an output level of said dual signal at the first level when the output level of said exclusive-OR is the second level, while compulsorily setting an output level of said exclusive-OR at the second level when the output level of said dual signal is the first level, and
   circuit means coupled to said interpolation circuit for providing an adding function.

4. A logic circuit, comprising:
a first input terminal with a first logic signal taking a first or second level input thereto,
a second input terminal with a second logic signal taking a first or second level input thereto,
a first output terminal for outputting an exclusive-OR,
a second output terminal for outputting a dual signal of said exclusive-OR,
a dual signal generation circuit having
    first conductivity type first and second transistors connected in series between said first level use power supply potential and said second output terminal, turning ON when the signal of second level is supplied to the control terminal, while cutting off when the signal of first level is supplied,
    a second conductivity type first transistor connected between said first input terminal and said second output terminal, turning ON when the signal of first level is supplied to the control terminal, while cutting off when the signal of second level is supplied, and
    a second conductivity type second transistor connected between said second input terminal and said second output terminal, turning on when the signal of first level is supplied to the control terminal, while cutting off when the signal of second level is supplied,
an exclusive-OR generation circuit having
    a first conductivity type third transistor connected between said first input terminal and said first output terminal, turning ON when the signal of second level is supplied to the control terminal, while cutting off when the signal of first level is supplied,
    a first conductivity type fourth transistor connected between said second input terminal and said first output terminal, turning on when the signal of second level is supplied to the control terminal, while cutting off when the signal of first level is supplied, and
    second conductivity type third and fourth transistors connected in series between said second level use power supply potential and said first output terminal, turning on when the signal of first level is supplied to the control terminal, while cutting off when the signal of second level is supplied, and
an interpolation circuit having
    a first conductivity type fifth transistor connected in series between said first level use power supply potential and said second output terminal, turning on when the signal of second level is supplied to the control terminal, while cutting off when the signal of first level is supplied, and
    a second conductivity type fifth transistor connected in series between said second level use power supply potential and said first output terminal, turning on when the signal of first level is supplied to the control terminal, while cutting off when the signal of second level is supplied, wherein
the control terminals of said first conductivity type second and fourth transistors and second conductivity type second and third transistors are connected to said first input terminal,
the control terminals of said first conductivity type first and third transistors and second conductivity type first and fourth transistors are connected to said second input terminal,
the control terminal of said first conductivity type fifth transistor is connected to said first output terminal,
the control terminal of said second conductivity type fifth transistor is connected to said second output terminal, and
circuit means coupled to said interpolation circuit for providing an adding function.

5. A logic circuit as set forth in claim 4, wherein:
said first conductivity type first, second, third, fourth, and fifth transistors are p-channel field effect transistors, and
said second conductivity type first, second, third, fourth, and fifth transistors are n-channel field effect transistors.

6. A full adder, comprising:
a logic circuit having
    an exclusive-OR generation circuit for receiving a first logic signal and a second logic signal taking a first or second level and generating an exclusive-OR of the first logic signal and second logic signal,
    a dual signal generation circuit for receiving the first logic signal and the second logic signal taking the first or second level and generating a dual signal of the exclusive-OR of the related first logic signal and second logic signal, and
    an interpolation circuit for compulsorily setting an output level of said dual signal at the first level when the output level of said exclusive-OR is the second level,
a sum signal generation circuit for generating a sum signal based on an exclusive-OR output and a dual signal output of said logic circuit, and
a carry signal generation circuit for generating a carry signal by selecting said first logic signal or carry signal based on the exclusive-OR output and the dual signal output of said logic circuit.

7. A full adder, comprising:
a logic circuit having
    an exclusive-OR generation circuit for receiving a first logic signal and a second logic signal taking a first or second level and generating an exclusive-OR of the first logic signal and second logic signal, a dual signal generation circuit for receiving the first logic signal and the second logic signal taking the first or second level and generating a dual signal of the exclusive-OR of the first logic signal and second logic signal, and
    an interpolation circuit for compulsorily setting the output level of said exclusive-OR at the second level when the output level of said dual signal is the first level;
a sum signal generation circuit for generating a sum signal based on then exclusive-OR output and the dual signal output of said logic circuit; and
a carry signal generation circuit for generating a carry signal by selecting said first logic signal or carry signal based on the exclusive-OR output and the dual signal output of said logic circuit.

8. A full adder, comprising
a logic circuit having
    an exclusive-OR generation circuit for receiving a first logic signal and a second logic signal taking a first or second level and generating an exclusive-OR of the first logic signal and second logic signal,
    a dual signal generation circuit for receiving the first logic signal and the second logic signal taking the first or second level and generating a dual signal of the exclusive-OR of the first logic signal and second logic signal, and an interpolation circuit for compulsorily setting an output level of said dual signal at the first level when the output level of said exclusive-OR is the second level, while compulsorily setting the output level of said exclusive-OR at the second level when the output level of said dual signal is the first level;

a sum signal generation circuit for generating a sum signal based on an exclusive-OR output and a dual signal output of said logic circuit; and a carry signal generation circuit for generating a carry signal by selecting said first logic signal or carry signal based on the exclusive-OR output and the dual signal output of said logic circuit.

9. A full adder, comprising:

a logic circuit having
  a first input terminal with a first logic signal taking a first or second level input thereto,
  a second input terminal with a second logic signal taking a first or second level input thereto,
  a first output terminal for outputting an exclusive-OR,
  a second output terminal for outputting a dual signal of said exclusive-OR,
  a dual signal generation circuit which has
    first conductivity type first and second transistors connected in series between said first level use power supply potential and said second output terminal, turning ON when the signal of second level is supplied to the control terminal, while cutting off when the signal of first level is supplied,
    a second conductivity type first transistor connected between said first input terminal and said second output terminal, turning ON when the signal of first level is supplied to the control terminal, while cutting off when the signal of second level is supplied, and
    a second conductivity type second transistor connected between said second input terminal and said second output terminal, turning on when the signal of first level is supplied to the control terminal, while cutting off when the signal of second level is supplied,
  an exclusive-OR generation circuit which has
    a first conductivity type third transistor connected between said first input terminal and said first output terminal, turning ON when the signal of second level is supplied to the control terminal, while cutting off when the signal of first level is supplied,
    a first conductivity type fourth transistor connected between said second input terminal and said first output terminal, turning on when the signal of second level is supplied to the control terminal, while cutting off when the signal of first level is supplied, and
    second conductivity type third and fourth transistors connected in series between said second level use power supply potential and said first output terminal, turning on when the signal of first level is supplied to the control terminal, while cutting off when the signal of second level is supplied, and
  an interpolation circuit which has
    a first conductivity type fifth transistor connected in series between said first level use power supply potential and said second output terminal, turning on when the signal of second level is supplied to the control terminal, while cutting off when the signal of first level is supplied, and
    a second conductivity type fifth transistor connected in series between said second level use power supply potential and said first output terminal, turning on when the signal of first level is supplied to the control terminal, while cutting off when the signal of second level is supplied, wherein
  the control terminals of said first conductivity type second and fourth transistors and second conductivity type second and third transistors are connected to said first input terminal,
  the control terminals of said first conductivity type first and third transistors and second conductivity type first and fourth transistors are connected to said second input terminal,
  the control terminal of said first conductivity type fifth transistor is connected to said first output terminal, and
  the control terminal of said second conductivity type fifth transistor is connected to said second output terminal;

a sum signal generation circuit for generating a sum signal based on an exclusive-OR output and a dual signal output of said logic circuit; and a carry signal generation circuit for generating a carry signal by selecting said first logic signal or carry signal based on the exclusive-OR output and the dual signal output of said logic circuit.

10. A full adder as set forth in claim 9, wherein:

said first conductivity type first, second, third, fourth, and fifth transistors are p-channel field effect transistors, and said second conductivity type first, second, third, fourth, and fifth transistors are n-channel field effect transistors.

* * * * *